United States Patent [19]
Aaldering

[11] Patent Number: 6,069,488
[45] Date of Patent: May 30, 2000

[54] PROGRAMMABLE LOGIC DEVICE WITH VERSATILE EXCLUSIVE OR ARCHITECTURE

[75] Inventor: Mark Merrill Aaldering, San Jose, Calif.

[73] Assignee: Xilinx, Inc., San Jose, Calif.

[21] Appl. No.: 08/970,997

[22] Filed: Nov. 14, 1997

[51] Int. Cl.$^7$ .............................................. H03K 19/177
[52] U.S. Cl. .............................................. 326/39; 326/41
[58] Field of Search .............................. 326/39, 41, 56, 326/38, 40

[56] References Cited

U.S. PATENT DOCUMENTS

| | | |
|---|---|---|
| 4,422,072 | 12/1983 | Cavlan . |
| 4,503,387 | 3/1985 | Rutledge et al. .......................... 326/39 |
| 4,703,206 | 10/1987 | Cavlan . |
| 4,758,746 | 7/1988 | Birkner . |
| 4,847,612 | 7/1989 | Kaplinsky ................................. 326/39 |
| 4,967,107 | 10/1990 | Kaplinsky ................................. 326/38 |
| 5,136,188 | 8/1992 | Ha et al. ................................... 326/39 |
| 5,245,227 | 9/1993 | Furtek . |
| 5,317,209 | 5/1994 | Garverick . |

FOREIGN PATENT DOCUMENTS

| | | |
|---|---|---|
| 0340890A2 | 11/1989 | European Pat. Off. . |
| 0725483A2 | 8/1996 | European Pat. Off. . |

*Primary Examiner*—Jon Santamauro

[57] ABSTRACT

A programmable logic device (PLD) includes a fixed EXCLUSIVE OR gate and a programmable logic array (PLA). The PLA includes a plurality of AND gate and a plurality of OR gates, the output of each AND gate being programmably connected to an input of each of the plurality of OR gates. The output of one of the OR gates of the PLA array is fed to one of the inputs of the fixed EXCLUSIVE OR. Since the output of each of the AND gates is available to each of the OR gates in the PLA array, implementation of the EXCLUSIVE OR function is facilitated and the number of product terms (AND gates) required is reduced as compared to known PLDs. The output of a programmable array logic (PAL) array having a plurality of AND gates non-programmably connected to an OR gate is connected to the other one of the inputs of the fixed EXCLUSIVE OR gate. Very wide EXCLUSIVE OR functions are readily implemented using a plurality of identical logic cells having the above architecture, each of which generate an intermediate result which is fed to a final logic cell implementing a wide EXCLUSIVE OR of the intermediate results.

10 Claims, 5 Drawing Sheets

6,069,488

PROGRAMMABLE LOGIC DEVICE WITH VERSATILE EXCLUSIVE OR ARCHITECTURE

BACKGROUND OF THE INVENTION

1. Field of the Invention

The invention relates to programmable logic devices ("PLD's"), and more particularly, to PLD's which implement an EXCLUSIVE OR function.

2. Description of the Prior Art

PLD's are well known and widely used in the field of semiconductor digital integrated circuits. A PLD generally includes multiple arrays of AND gates and OR gates interconnected in various combinations. The devices contain gates which are connected by fixed connections and gates which are connected by electrically programmable connections, such as fuses. The AND gates implement the boolean logic "AND" function to provide the product of selected inputs while the OR gates implement the boolean logic "OR" function to provide the sum of selected inputs. An OR gate whose inputs are the outputs of a plurality of AND gates implements the boolean Sum of Products function. Given enough products, often referred to for convenience as "p-terms", the sum of the products can express all boolean transfer functions.

The range of intended applications for the device influences the number of gates in the arrays, their layout, and how they are interconnected by the fixed and programmable connections. Such devices are highly useful because they enable the manufacturer or the end user, all within a single device design, to implement a large variety of boolean logic functions through programming of the programmable connections interconnecting the various AND gates and OR gates.

It is desirable in many applications to implement an EXCLUSIVE OR ("XOR") function in such a device. The EXCLUSIVE OR function is needed, for example, in arithmetic and parity generation circuits. As known from boolean logic equations, this function may be implemented programmably in a device having an array of programmable AND gates and an OR gate arranged to implement a Sum of Products, such as with an AND array feeding a fixed OR gate. In practice, however, this takes up an excessive number of product terms (AND gates). Implementing an EXCLUSIVE OR function that is N-bits wide (N inputs) requires $2^{N-1}$ programmable product terms to implement. For example, an EXCLUSIVE OR with five (5) inputs requires sixteen (16) product terms (programmable AND gates) to implement in this manner. An EXCLUSIVE OR function of three inputs A, B, C requires four (4) product terms and is written in sum of products notation as:

$$XOR\ (A, B, C) = A\ *xor*\ B\ *xor*\ C$$
$$= (A\ \&!B\ \&!C)\#(!A\ \&B\ \&!C)\#(!A\ \&!B\ \&C)\#(A\ \&B\ \&C),$$

where

"&" denotes the logical AND,

"#" denotes the logical OR, and

"!" denotes the inverse of a variable.

FIG. 1 illustrates the implementation of the above three-wide XOR function with AND and OR gates.

Alternatively, it is known to include a so-called silicon XOR (hereinafter referred to as "fixed EXCLUSIVE OR" or "fixed XOR") in the output path of a PLD. A fixed XOR is made up of a combination of AND and OR gates non-programmably connected to each other. One example of a fixed XOR is shown in FIG. 2 and includes two AND gates 1, 2 each having an output feeding a respective input of OR gate 3. The AND gate 2 receives the input signal A and the inverse of input signal B while AND gate 1 receives the inverse of input signal A and the non-inverted input signal B. The output signal A *xor* B is then the logical EXCLUSIVE OR of the two input signals A, B. It should be noted that fixed XOR gates may be constructed in other ways known in the art, several of which are described in the text: Jacob Milman, Micro-electronics, at pages 133–34, McGraw Hill, Inc., New York, N.Y.

One known PLD having a fixed XOR is shown in FIG. 3 and includes a full Sum of Products branch 11 on the first input 15 and a single product term 7 as the second input 14 to the fixed XOR 16. The Sum of Products branch 11 includes a plurality of AND gates 8-1 through 8-M each having its OR output fed via a non-programmable connection to OR gate 9. Each AND gate is programmably connectable to each of a plurality of N inputs. The Sum of Products branch 11 connected to the first input 15 of the fixed XOR gate 16 may be programmed to implement an EXCLUSIVE OR function using boolean equations in addition to the fixed XOR 16. Eight (8) product terms (AND gates 8-1 ... 8—8) from the Sum of Products branch 11 can be used to build a four (4) wide XOR which in turn propagates into the fixed XOR gate 16, making a total width of the implemented EXCLUSIVE OR function five (5) inputs wide. In comparison, as noted above, without the fixed XOR gate, the user would require sixteen (16) AND gates to implement a five (5) input EXCLUSIVE OR function.

U.S. Pat. No. 4,758,746 shows a PLD architecture with a plurality of logic cells, each having a fixed XOR, an OR gate and a number of product terms which can feed the OR gate and the fixed XOR. The disclosed architecture permits the product terms that are generated in the AND array of a first logic cell to be steered to a second logic cell, so that the OR and XOR gates of the second cell can use the product terms of the first cell. While providing some flexibility, product terms that are allocated to a given logic cell are stolen away from another cell. This limits the devices usefulness in implementing very wide EXCLUSIVE ORs.

It is an object of the invention to provide a PLD in which the number of product terms necessary to implement wide EXCLUSIVE OR's is reduced compared to the known devices.

It is another object of the invention to provide a PLD in which wide EXCLUSIVE ORs can be calculated in a shorter time than known devices.

It is another object of the invention to provide such a device which remains flexible to implement other boolean functions in an efficient manner in addition to implementing the EXCLUSIVE OR function.

SUMMARY OF THE INVENTION

Generally speaking, according to the invention, a programmable logic device includes a plurality of input lines for carrying a plurality of input signals, a first, programmable logic array, and a fixed EXCLUSIVE OR gate. The first, programmable logic array has a plurality of programmable AND gates, each AND gate having a respective output and a plurality of inputs each electrically programmably connected to associated ones of said plurality of input lines, and a programmable OR gate having an output and a plurality of inputs each electrically programmably connected to each of the outputs of the plurality of AND gates. The fixed EXCLUSIVE OR gate has first and second inputs and an EXCLUSIVE OR output, the first input being coupled to receive the output of the programmable OR gate. Favorably, the first, programmable logic array includes a plurality of additional programmable OR gates, each having an output and a plurality of inputs electrically programmably connected to each output of said plurality of AND gates.

Such an array having a plurality of AND gates each having an output programmably connected to the input of a plurality of OR gates is known in the art as a PLA, for "programmable logic array". Having a PLA on one input of a fixed XOR provides a significant reduction in the use of product terms, while also reducing processing times, when implementing very wide EXCLUSIVE ORs, as compared to the known devices. Within the PLA, every product term (AND gate) is available to every OR gate. As will be explained in further detail, all of the product terms can be fed to the one OR gate (connected to the fixed XOR) to implement an intermediate result of the EXCLUSIVE OR function while these same product terms are used by multiple other OR gates to simultaneously generate other boolean functions. Thus, the limitations of the '746 architecture with respect to product term starvation from neighboring logic cells and the inability to share product terms with multiple outputs is overcome by the architecture according to the invention.

According to another embodiment, the second input of the EXCLUSIVE OR gate receives the logic output of a second array of logic gates. The second array may be, for example, a programmable array logic including (i) a plurality of AND gates each having a plurality of inputs electrically programmably connected to a second plurality of input lines and an output and (ii) a plurality of OR gates, each having an output and a plurality of inputs non-programmably connected to a respective one of the outputs of each of the AND gates of the second array.

According to another favorable aspect of the invention, the programmable logic device includes a switching device to disconnect the EXCLUSIVE OR gate from the one OR gate of the first logic array and to connect the output of the one OR gate to an output of the PLD or to the input of another device within the PLD. In one embodiment, the device includes an additional OR gate having an input coupled to the switch for receiving the output of the one OR gate of the programmable logic array.

In another embodiment, the device includes a plurality of logic cells, each logic cell comprising a further plurality of the input lines, a further one of the first, programmable logic arrays logic cells, each logic cell comprising a further plurality of the input lines, a further one of the first, programmable logic arrays and a further one of the fixed XOR gates. A first number of the logic cells have the outputs of their fixed XOR gates coupled to the input array of a final one of the logic cells. Such an arrangement is efficient in producing a very wide XOR, with each of the first number of logic cells generating an intermediate result of the EXCLUSIVE OR function, which intermediate result is then input to the final logic cell which outputs the very wide EXCLUSIVE OR result.

These and other object, features and advantages of the invention will become apparent with reference to the following detailed description and the drawings.

DETAILED DESCRIPTION OF THE PREFERRED EMBODIMENTS

Figure 4B:
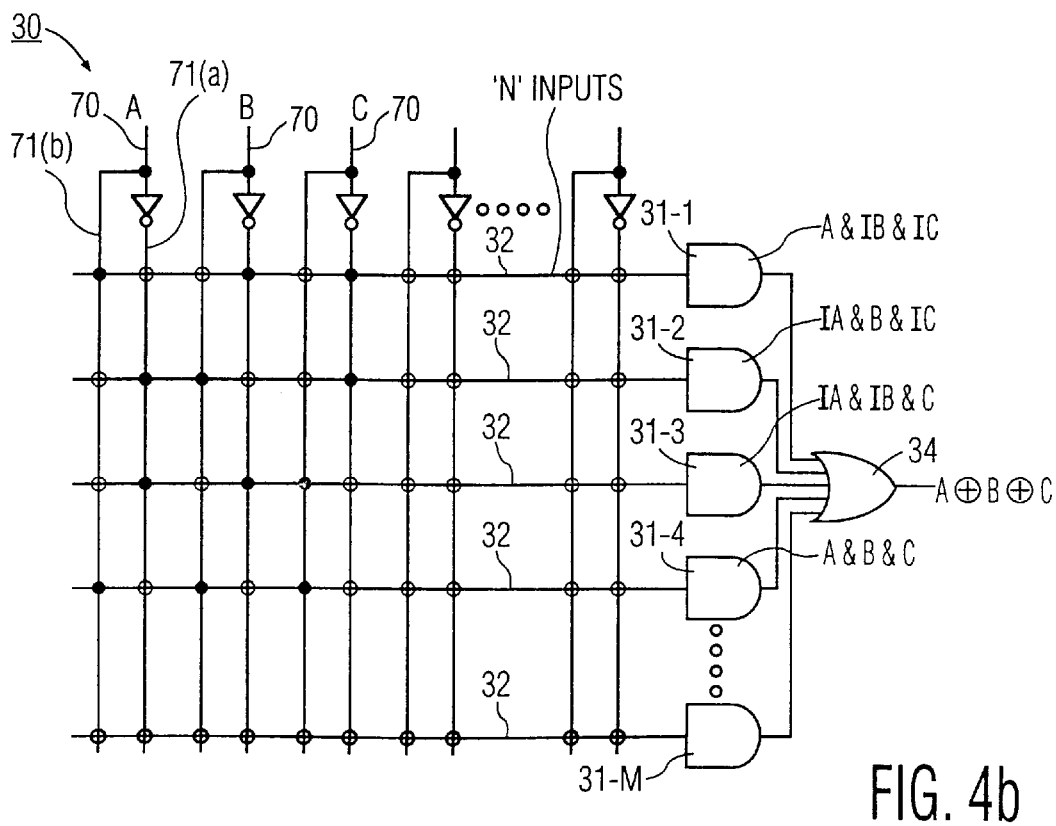
FIG. 4(b) illustrates one architecture for the connection of input signals to the arrays of FIG. 4(a)
Figure 4A:
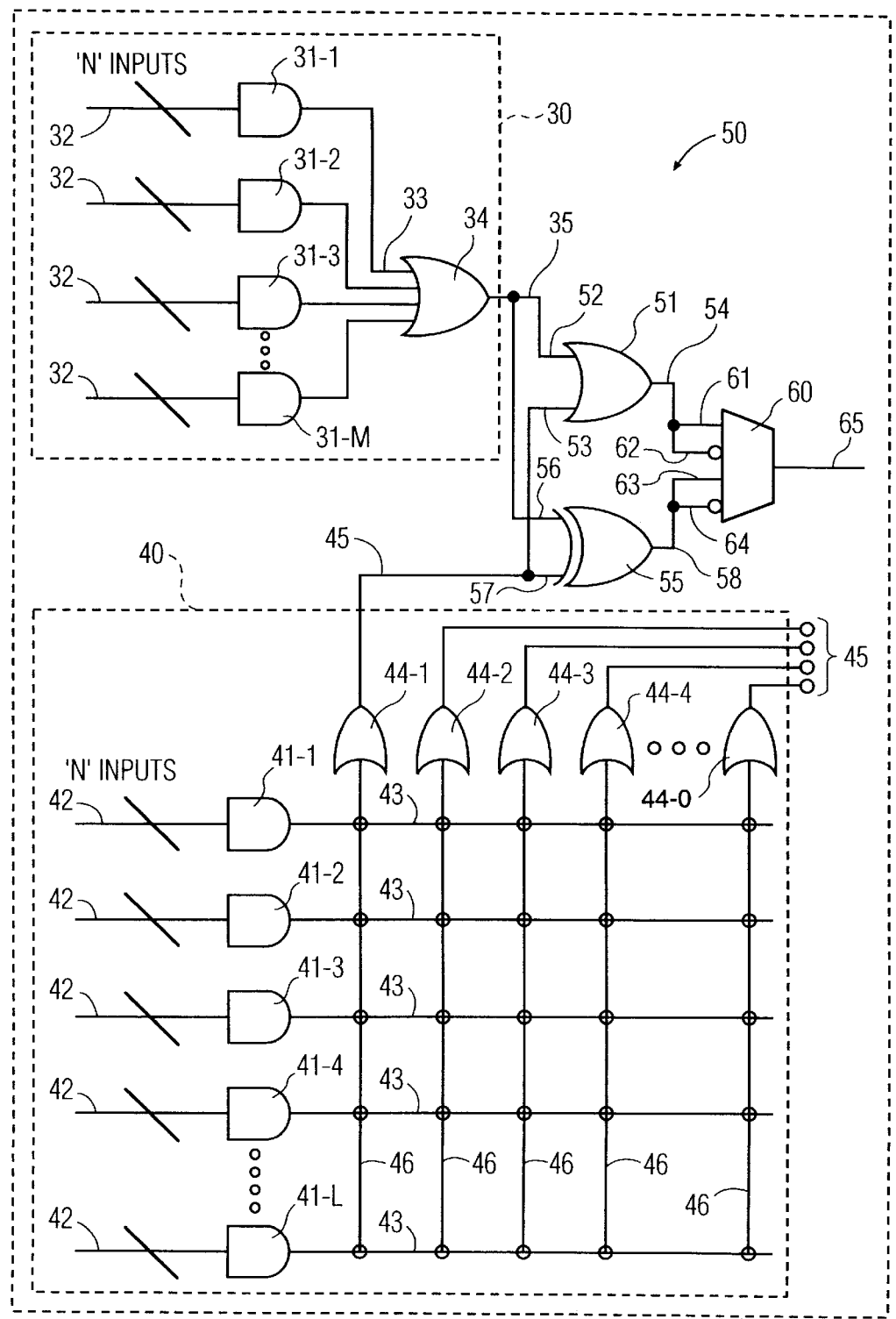
FIG. 4(a) shows a programmable logic device according to the invention having an EXCLUSIVE OR gate with one input coupled to a programmable logic array.

FIG. 4(a) shows a logical representation of a logic cell 10 of one form of PLD architecture of the invention. The logic cell 10 includes a first array 30 and a second array 40 each feeding an output circuit 50 which includes a fixed XOR gate 55. The array 30 implements a Sum of Products and is known in the art as a PAL, for "programmable array logic". The array 30 includes a plurality (M) of AND gates 31 (31-1 . . . 31-M) each of which has a plurality (N) of inputs represented by the single slashed lines 32. Each AND gate 31 can be programmed to receive any of the N input signals. Each AND gate 31 has an output (collectively labeled 33) which has a non-programmable, or fixed, connection to a respective input of the OR gate 34. The OR gate 34 has an output 35 which is the Sum of Products of the signals provided on inputs 32.

The array 40 is known in the art as a PLA, for "programmable logic array". The PLA array 40 has an AND array including a plurality (L) of AND gates 41 (41-1 . . . 41-L). Each of the AND gates 41 has a plurality of inputs (N) represented by the slashed single line 42 and a respective output feeding output lines 43. The array 40 also includes an array of a plurality (O) of OR gates 44 (44-1 . . . 44-O) Each of the OR gates has a plurality (L) of inputs each having a programmable connection with any one of the output lines 43 so as to selectively receive the logical output of any of the AND gates 41-1 . . . 41-L. The programmable connection of each of the multiple inputs of the OR gates 44 to the output lines 43 is represented by the single lines 46 and the circled intersections with the lines 43. Each of the OR gates 44 has a respective logical OR provided on output lines 45.

As used herein, the term "programmable connection" means any device which is capable of being programmed to electrically close or open a circuit connection between two circuit elements which it functionally connects. Accordingly, this term includes, but is not limited to, fuses, antifuses, electrically-erasable floating gate memory elements and SRAM memory elements.

The output circuit 50 includes an OR gate 51 and the fixed XOR gate 55. The fixed XOR gate has one input 56 connected to the output 35 of the Sum of Products, or PAL, array 30 and its other input 57 connected to the OR output of OR gate 44-1 of the PLA array 40. Similarly, the OR gate 51 has one input 52 connected to the output 35 and its other input 53 connected via the respective output line 45 to the OR output of the OR gate 44-1. The logical OR output 54 of the OR gate 51 is connected to the non-inverted and inverted inputs 61, 62 of multiplexer 60 while the XOR output 58 of the fixed XOR gate 55 is connected to the inverted and non-inverted inputs 63, 64 of the multiplexer 60. The logical output of the cell 10 is at the output 65 of multiplexer 60. The multiplexer 60 is controllable by the user to allow the XOR path through the XOR gate 55 to be switched on when needed. The XOR gate 55 can be bypassed so that the Sum of Products branch through the OR gate 51 can be used when the XOR function is not needed. As a result, only those applications that require an XOR will be burdened with any timing penalty associated with using the XOR feature. Though not illustrated, the output 65 is typically connected to an output macrocell.

FIG. 4(b) illustrates a typical architecture for connecting the signal inputs of the AND gates of the PAL array 30. The same array or a similar array may be used for PLA array 40. A plurality of PLD input lines 70 are provided, each connected in series with an inverter 71 whose respective outputs provide opposite polarity (high and low; "1" or "0") signals of the signal input at a respective input 70 on lines 71(a). The non-inverted signal is available on line 71(b). Each dual line 71(a), 71(b) is connectable by a programmable connection to the multiple N inputs of each of the AND gates 31-1 . . . 31-M and 41-1 . . . 41-L of the PAL and PLA arrays 30, 40. This connectability is represented by the circle at each intersection of the lines. Thus, for example, where the AND gates 41 and 31 have eighty (80) inputs each, the input array would have (40) forty inputs, each AND gate then being capable of receiving forty signals and forty inverted signals. FIG. 4(b) also illustrates the implementation of an XOR function A*xor*B*XOR*C of the PAL array 30. For example, AND gate 31-1 provides the boolean product of A*!B*!C by selective connection of various ones of the 'N' input lines (represented by single line 32) to the non-inverted line 71(b) for input signal A and the inverted lines 71(a) of the input signals B and C.

Providing a PLD having an XOR gate in which at least one of the inputs is connected to an OR gate of a PLA as in FIG. 4(a) provides significant speed advantages and architectural efficiencies. This is because the programmable connections of the PLA array 40 can be programmed so that each of the product terms is received as an input to OR gate 44-1 of the PLA. Additionally, as shown in FIG. 4(a), the output of each of OR gates 44-2 through 44-O is not used in the XOR function and remains available to implement other boolean functions, each being programmably connectable to each of the AND gates 41-1 through 41-L, even if all of such AND gates are used in implementing an XOR function.

Figure 3:
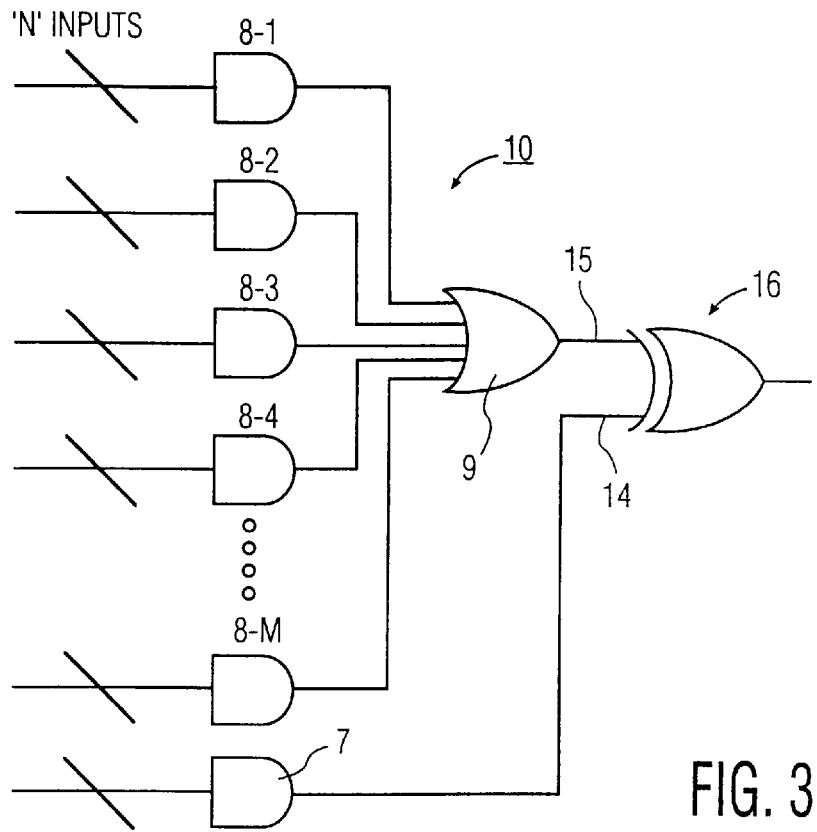
FIG. 3 shows a programmable logic device according to the prior art having an EXCLUSIVE OR gate.

Table 1 shows the significant reduction in the number of product terms (AND gates) for the above-described arrangement as compared to the situation where the two inputs are sum of products arrays with fixed OR terms, as with PAL array 30, and as compared to the prior art circuit of FIG. 3.

TABLE 1

| DESIRED XOR WIDTH | PRODUCT TERMS USED WITHOUT SILICON XOR | PRODUCT TERMS USED WITH TRADITIONAL SILICON XOR (FIG. 3) | PLA ON ONE BRANCH OF XOR AS IN FIG. 4A |
| --- | --- | --- | --- |
| 2 | 2 | 2 | 2 |
| 3 | 4 | 3 | 3 |
| 4 | 8 | 5 | 4 |
| 5 | 16 | 9 | 6 |
| 6 | 32 | 17 | 8 |
| 7 | 64 | 33 | 12 |
| 8 | 128 | 65 | 20 |

As an example for the PLD illustrated in FIG. 4(a), there can be provided N=80 inputs for the PAL array 30 comprising M=4 AND gates 31 while the PLA array 40 may have L=32 of AND gates 41 and O=20 OR gates 44. The invention is not limited to these numbers of components and other numbers of components are considered within the scope of the invention.

Figure 1:
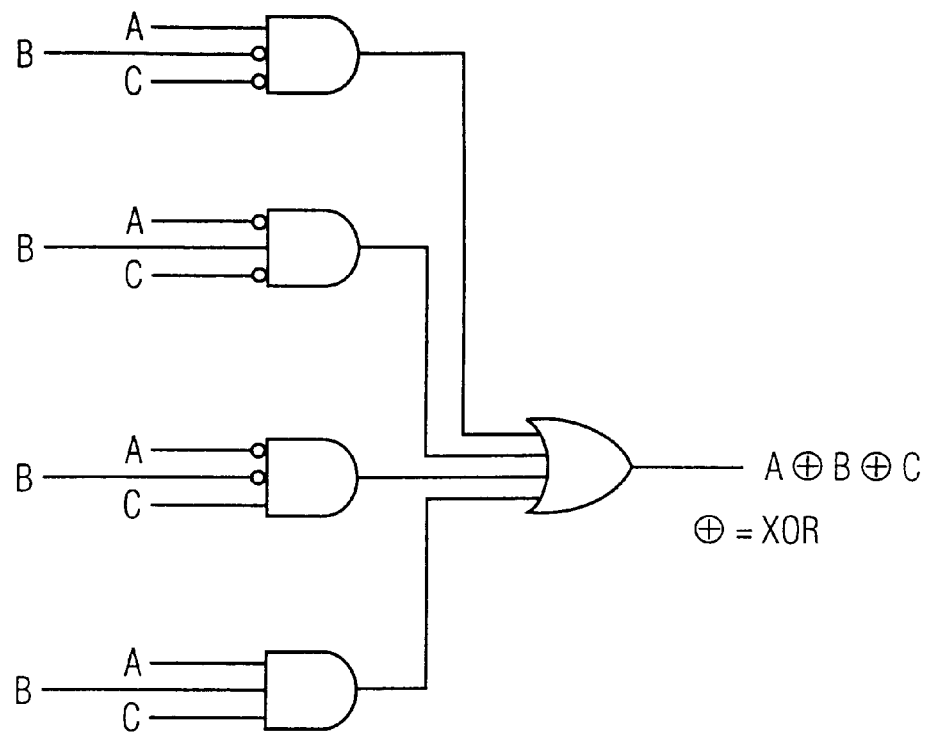
FIG. 1 illustrates a three bit wide EXCLUSIVE OR implemented with AND and OR gates (prior art)
Figure 2:
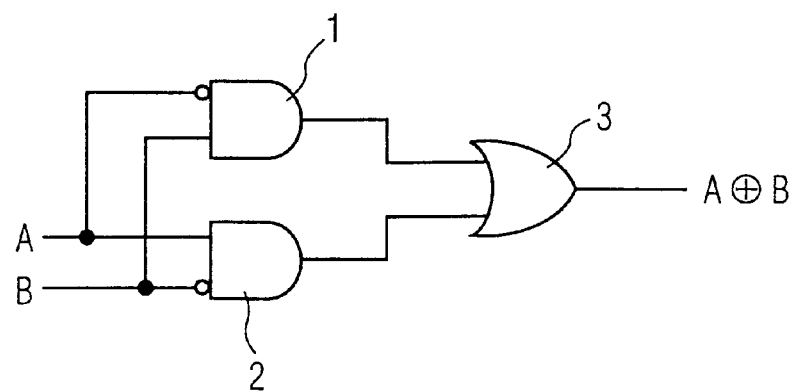
FIG. 2 illustrates one type of fixed EXCLUSIVE OR gate prior art)

In a favorable embodiment, multiple, identical logic cells are used to implement a very wide XOR function with high speed. Before turning to such embodiment, first a relatively simple example is given to illustrate the principles involved. Assume a logic cell consists of a PAL as in FIG. 1 with only four product terms, and thus the fixed OR gate 34 is limited to only four inputs. Such a cell can accommodate a three wide XOR, but not larger. (See Col. 2 of Table 1) Now if an output 'Out' of a four bit wide logical XOR function is desired, it can not be directly accommodated with such a logic cell. The output of this four bit wide XOR function can be written as: t,130

This four bit wide XOR function requires eight product terms (to implement the boolean equations within each of the eight parenthesis in the above equation) that feeds a final OR gate (which implements the boolean OR ("#") of the eight product terms). This is much wider than can be accommodated by a single PAL array having only four product terms. However, the four bit wide XOR function can still be carried out with a first step that creates an intermediate result followed by a second step which uses the intermediate result with the remaining inputs to be logically XORed. This four bit wide logical XOR of A, B, C, D can be implemented with two such PAL arrays, as follows:

Intermediate=A *xor* B *xor* C;

Out=Intermediate *xor* D.

The Boolean equivalent of the above equations is:

Intermediate=(A&!B&!C)#(!A&B&!C)#(!A&!B&C)#(A&B&C);

Out=(Intermediate &!D)#(!Intermediate & D).

Figure 5:
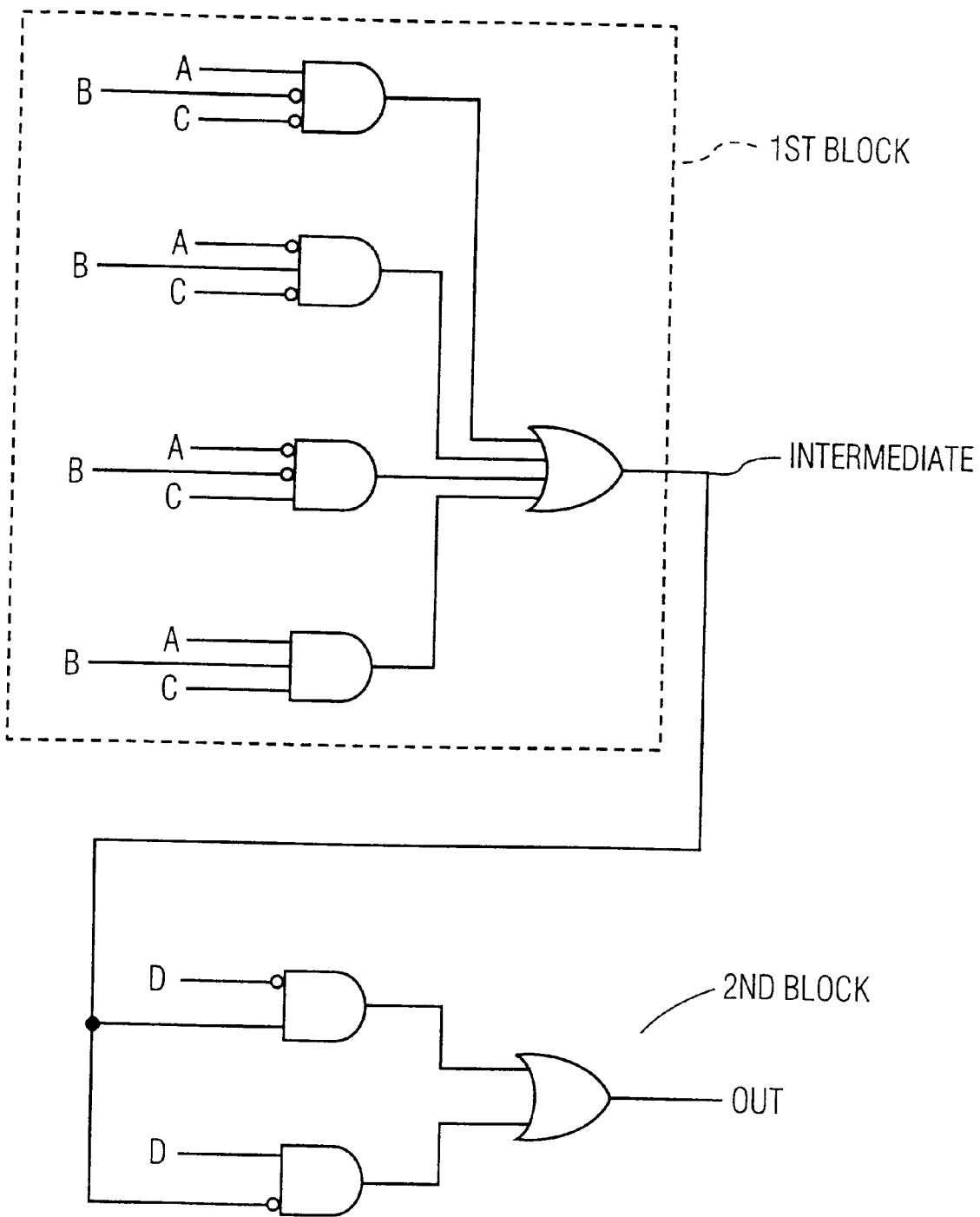
FIG. 5 is an illustrative example of the use of multiple arrays of product terms to implement the EXCLUSIVE OR function.

The gate level implementation for these two boolean equations is illustrated in FIG. 5.

By splitting the boolean equation for the four bit wide logical XOR into two discrete sections, each section can be handled by a PAL array whose capacity is a 3-bit XOR function. The first block labeled "1st Block" would be implemented in a PLD in one logic cell with four (4) product terms of a PAL array. The result "Intermediate" would be fed back into a second PAL array where it would be logically XORed with the input D. This takes two passes, each serially through a respective PAL array, however, and therefore takes twice as long to generate a result than if it could be done in a single logic cell.

Thus, a complex programmable logic device "(CPLD)" architecture having several logic cells can implement an XOR function which is wider than one logic cell alone can handle. If each logic cell has a relatively narrow input, several passes through the multiple cells will be required, slowing performance. Therefore, any architecture which allows each logic cell in the device to accomplish a wider XOR function in a single pass, will also allow much wider XOR operations to be accomplished in several passes. For example, if each logic cell had eight product terms per output, this would enable each cell to generate a 5 bit wide logical XOR. Therefore, in two passes through the array, a 25 bit wide XOR could be accomplished instead of a 16 bit XOR, as with the example with a three bit-wide PAL array.

Figure 6:
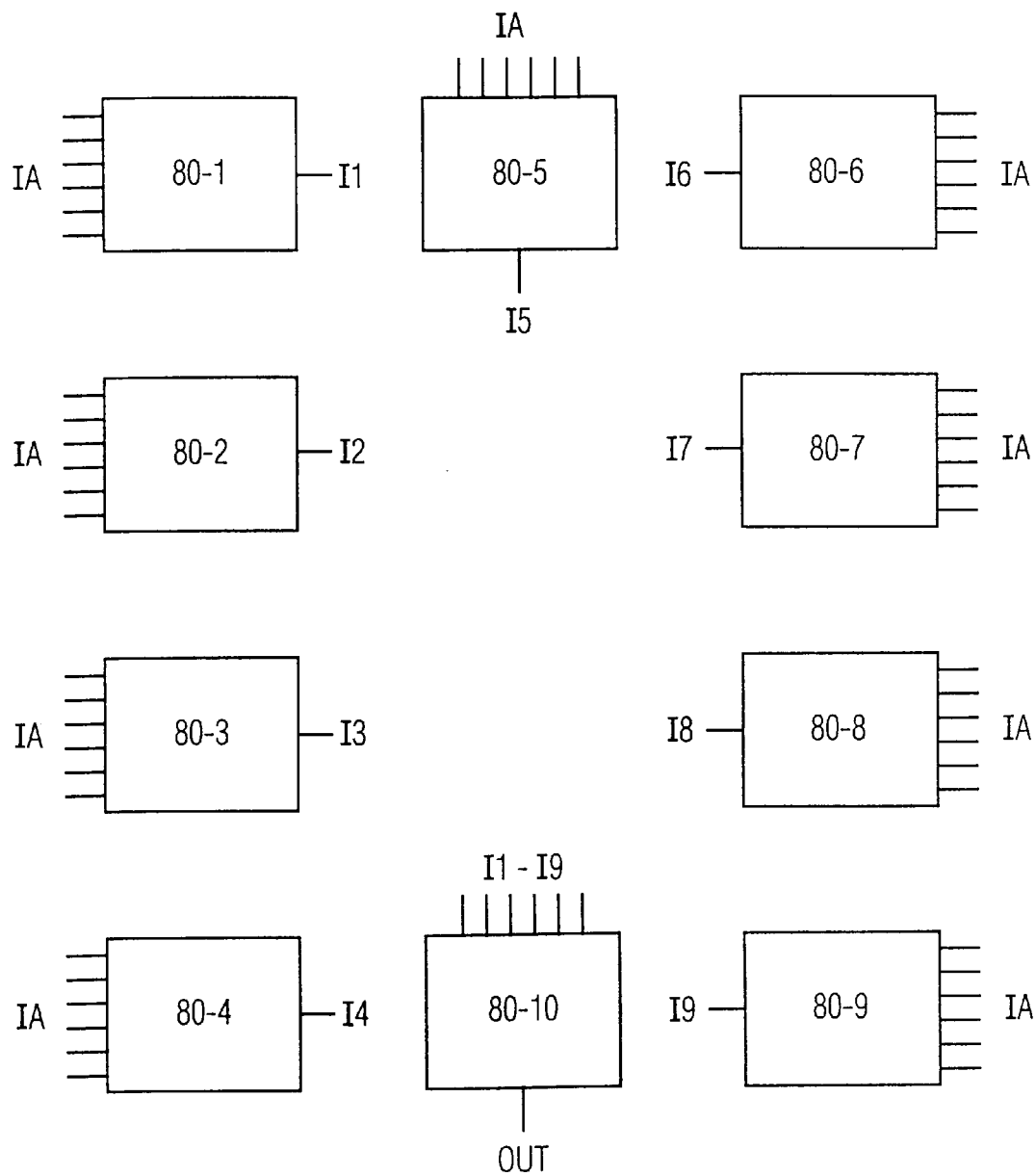
FIG. 6 illustrates a programmable logic device including a plurality of logic cells each formed of the circuit of FIG. 4(a) for carrying out a very wide EXCLUSIVE OR function.

Now, FIG. 6 shows a block diagram according to the invention of a circuit which is suitable for implementing a very wide XOR. Each of the blocks 80-1 through 80-9 implements a logic cell according to the circuit of FIG. 4(a).

In this example, the PLD has the capacity to implement an 81 bit XOR function. Each logic cell 80-1 through 80-10 implements a 9 bit wide XOR function in one pass through that cell. With reference to FIG. 4a, in each logic cell 10 the PLA array 40 has thirty two (32) product terms. These product terms implement a six (6) bit wide logical XOR in the PLA array 40. The PAL array 30 has five (5) dedicated product terms, four (4) of which are used to implement a three (3) bit wide logical XOR in parallel (at the same time) as the six (6) bit wide XOR being computed in the PLA array 40. As in the example above, the intermediate result from the PAL array 30 and the intermediate result from the PLA array 40 are logically XORed together. In this embodiment, these intermediate results within the logic cell 10 are XORed by the fixed XOR 55 of the output circuit 50. Thus, in a single pass, each logic cell 10 computes a nine (9) bit wide XOR from the input to that logic cell from the input array IA. The number of bits (e.g., nine bits) computed by each logic cell 10 is defined as the bitwise capacity of that logic cell. Now, the output (I1–I9) of each logic cell 80-1 through 80-9 is in turn an intermediate boolean result of the 81 bit wide XOR. These 9 outputs are then fed as inputs to the final cell 80-10, which computes the logical XOR of these nine (9) intermediate results and provides the 81 bit wide XOR result at the output OUT. Thus, an 81 bit wide XOR is accomplished in only two serial (time wise) passes, with one pass (computed simultaneously) through each of the nine logic cells 80-1 through 80-9 and the second pass through the final cell 80-10.

The physical connection of the logic cells 80-1 through 80-9 to the final cell 80-10 is not shown for the sake of simplicity and as being well within the skill of those in the art. The connection of the output of cells 80-1 through 80-9 to the input of cell 80-10 could be directly hardwired, but typically would include intermediate macrocells which include steering and/or further processing functions. Additionally, the input array IA would typically be common to and available for all of the cells.

It is again noted that the architecture of each logic cell allows this very wide XOR to be computed at high speed with a significantly reduced number of product terms as compared to presently known devices. A device not having the large number of product terms programmably available to the OR gate 44-1 that the PLA array 40 has would not be nearly as efficient as the present invention. Without the silicon, or fixed XOR, in combination with the PLA array, a nine (9) bit wide XOR would require two hundred fifty six (256) product terms, instead of the thirty six (36) used in each logic cell in the implementation of FIG. 6. Thus, placing a fixed XOR between a PLA array and a PAL array allows very wide logical EXCLUSIVE OR functions to be computed at high speeds, with significantly reduced number of gates. By contrast, the routing mechanism of the '746 patent, while offering the flexibility to put dense logic where it is needed most for certain purposes, is not efficient for implementing very wide logical EXCLUSIVE OR functions because of product term starvation from neighboring logic cells and the inability to share product terms with multiple outputs.

The arrangement described in FIG. 6 was found to provide a significantly faster XOR output for very wide XOR widths than any circuits commercially known to the present inventors. A 31 bit wide XOR function was implemented in 12 nanoseconds, which is 3 times faster than any commercially available circuits known. An 81 bit wide XOR was implemented in 15 nanoseconds, which is about 4 times faster than known circuits. This is significant, because these much faster operating speeds permit the use of PLDs implementing the XOR function in applications previously unsuited to present PLDs, such as in parity generation and boolean arithmetic.

The process or technology by which the PLD of the invention is made is not important and any of the standard bipolar, NMOS or CMOS processes can be used. Also, it will be clear from the foregoing that the number of array elements, i.e., the array size, in any of the arrays can be varied without departing from the principles described herein.

As noted above, Programmable Array Logic (PAL) and Programmable Logic Array (PLA) are known commercial architectures. U.S. Pat. No. 4,124,899 describes the PAL type of PLDs, and U.S. Pat. Nos. 4,422,072 and 4,703,206 describe in detail the PLA type of PLDs. Since the description in these patents are so detailed and complete, it is unnecessary to repeat those details here, and the full contents of those three patents are herewith incorporated by reference.

Although preferred embodiments of the present invention have been shown and described, it will be appreciated by those skilled in the art that changes may be made in these embodiments without departing from the principles and spirit of the invention, the scope of which is defined in the claims. For example, those of ordinary skill in the art will appreciate that the number of logic cells and the capacity of each logic cell of the circuit of FIG. 6 can be varied as needed for a particular range of applications.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A programmable logic device, comprising:

a plurality of input lines for carrying a plurality of input signals;

a first logic array, said first logic array being a programmable logic array comprising:

a first plurality of programmable AND gates, each AND gate having an output and a plurality of inputs, each input being programmably connectable to said plurality of input lines, and a first OR gate, said first OR gate having an output and a plurality of inputs, each input being programmably connectable to each of the outputs of said first plurality of AND gates;

a second logic array, separate from said first logic array, said second logic array being programmable array logic comprising:

a second plurality of AND gates, each AND gate having an output and a plurality of inputs, each input being programmably connectable to said plurality of input lines, and a second OR gate, said second OR gate having an output and a plurality of inputs, each input being non-programmably connected to a respective one of the outputs of said second plurality of AND rates;

an EXCLUSIVE OR gate, said EXCLUSIVE OR gate having a first input, a second input, and an output, said first input of said EXCLUSIVE OR gate being non-programmably connected to the output of said first OR gate, and said second input of said EXCLUSIVE OR gate being non-programmably connected to the output of said second OR gate; and an output line for carrying an output signal of the programmable logic device coupled to the output of said EXCLUSIVE OR gate.

2. A programmable logic device according to claim 1, wherein said first programmable logic array comprises a plurality of additional OR gates, each OR gate having an output and a plurality of inputs programmably connectable to each output of said first plurality of AND gates.

3. A programmable logic device according to claim 1, further comprising a switching means for disconnecting the output of said EXCLUSIVE OR gate from said output line.

4. A programmable logic device according to claim 3, further comprising a third OR gate having an input connected to the output of said first OR gate, said switching means being switchable to alternately connect the output of said third OR gate and the output of said EXCLUSIVE OR gate to said output line.

5. A programmable logic device according to claim 1, comprising a plurality of logic cells, each logic cell comprising a further plurality of said input lines, a further one of said first logic array, a further one of said second logic array, a further one of said EXCLUSIVE OR gate, and a further one of said output line.

6. A programmable logic device, comprising:

a plurality P of logic cells, each logic cell including:

a fixed EXCLUSIVE OR gate having an output connected to a logic cell output, a first input, and a second input, a first array, said first array being a programmable logic array comprising:

a first OR gate having an output and a plurality of inputs, and a first plurality of AND gates, each AND gate having an output programmably connectable to the input of said first OR gate, wherein a selected number of said AND gates implement an EXCLUSIVE OR function M bits wide, a second array, said second array being programmable array logic comprising:

a second OR gate having an output and a plurality of inputs, and a second plurality of AND gates, each AND gate having an output non-programmably connected to a respective one of the inputs of said second OR gate, wherein a selected number of said AND gates implement an N bit wide EXCLUSIVE OR function, and means for coupling the output of said first OR gate and the output of said second OR gate, respectively, to said first and second inputs of said fixed EXCLUSIVE OR gate, whereby the bitwise capacity of each logic cell for implementing an EXCLUSIVE OR function is M+N bits;

input array means for connecting input data to said first plurality of AND gates and to said second plurality of AND gates in P-1 logic cells; and means for coupling the logic cell output of each of said P-1 logic cells to said first plurality of AND gates and said second plurality of AND gates of the Pth logic cell, whereby the bitwise capacity of the programmable logic device for implementing the EXCLUSIVE OR function is (P-1)×(M+N) bits input at said input array means.

7. A programmable logic device according to claim 6, wherein at least one of said logic cells further comprises a switching means for disconnecting the output of said fixed EXCLUSIVE OR gate from said logic cell output.

8. A programmable logic device according to claim 7, wherein said at least one of said logic cells further comprises a third OR gate having an input and an output, the output of said third OR gate being coupled to said switching means, said switching means being switchable to alternately connect the output of said fixed EXCLUSIVE OR gate and an output of said third gate to said logic cell output.

9. A programmable logic device (PLD) comprising a plurality of logic cells, each logic cell including:

a programmable logic array (PLA) having an output signal from a first OR gate;

a programmable array logic (PAL) having an output signal from a second OR gate; and a fixed EXCLUSIVE OR gate receiving input signals from the first and second OR gates and providing an output signal from the logic cell.

10. The PLD of claim 9, wherein each logic cell further includes:

a third OR gate receiving input signals from the first and second OR gates; and a multiplexer for selectively providing one of the output signal of the third OR gate and the output signal of the fixed EXCLUSIVE OR gate as the output signal of the logic cell.

\* \* \* \* \*